United States Patent
See et al.

(10) Patent No.: US 6,261,935 B1
(45) Date of Patent: Jul. 17, 2001

(54) METHOD OF FORMING CONTACT TO POLYSILICON GATE FOR MOS DEVICES

(75) Inventors: Alex See, Singapore (SG); Lap Chan, San Francisco, CA (US); Ravi Sundaresan, Plano, TX (US)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/458,725

(22) Filed: Dec. 13, 1999

(51) Int. Cl.$^7$ ................................................ H01L 21/4763
(52) U.S. Cl. ............................................... 438/592; 438/656
(58) Field of Search ...................................... 438/589, 592, 438/634, 653, 655, 656, 666, 683

(56) References Cited

U.S. PATENT DOCUMENTS

| | | | |
|---|---|---|---|
| 5,476,814 | 12/1995 | Ohshima et al. | 437/189 |
| 5,710,078 | 1/1998 | Tsens | 438/620 |
| 5,731,239 | 3/1998 | Wong et al. | 438/296 |
| 5,856,225 | 1/1999 | Lee et al. | 438/291 |
| 5,895,961 | 4/1999 | Chen | 257/382 |
| 5,904,533 | * 5/1999 | Lin | 438/592 |
| 6,074,921 | * 6/1999 | Lin | 438/592 |
| 6,093,628 | * 7/2000 | Lim et al. | 438/592 |
| 6,124,189 | * 9/2000 | Watanabe et al. | 438/653 |

* cited by examiner

*Primary Examiner*—Chandra Chaudhari
(74) *Attorney, Agent, or Firm*—George O. Saile; Rosemary L. S. Pike (57) ABSTRACT

A new method is provided for the creation of contact pads to the poly gate of MOS devices. STI regions are formed, layers of gate oxide, poly and SiN are deposited. The poly gate is patterned and etched leaving a layer of SiN on the surface of the gate. An oxide liner is created, an LDD implant is performed, the gate spacers are created and source/drain region implants are performed. A layer of titanium is deposited and annealed, a salicide etchback is performed to the layer of titanium creating silicided surfaces over the source and drain regions. Inter level dielectric (ILD) is deposited, the layer of ILD is polished down to the SiN layer on the top surface of the gate. The layer of SiN is removed creating a recessed gate structure. A stack of layers of titanium-amorphous silicon-titanium (Ti/Si/Ti) or a layer of $WSi_x$ is deposited over the layer of ILD filling the recess on top of the gate with Ti/Si/Ti. This Ti/Si/Ti (or $WSi_x$) is patterned and etched forming a Ti/Si/Ti stack (or layer of $WSi_x$) that partially overlays the layer of ILD while also penetrating the recessed opening of the gate electrode. The layer of Ti/Si/Ti is silicided and forms the contact pad to the gate structure.

28 Claims, 6 Drawing Sheets

METHOD OF FORMING CONTACT TO POLYSILICON GATE FOR MOS DEVICES

BACKGROUND OF THE INVENTION (1) Field of the Invention

The invention relates to the fabrication of integrated circuit devices, and more particularly, to a method of forming contacts to a polysilicon gate structure for MOS devices.

(2) Description of the Prior Art

The semiconductor industry continuous to place heavy emphasis on gaining device improvements by stressing reductions device feature dimensions. The reduction in device dimensions in general leads to device performance improvements even though the efforts to continue to reduce device features frequently poses unique technical challenges.

The trend toward continued miniaturization of semiconductor devices has led from the field for Very Large-Scale Integrated (VLSI) devices to the field of Ultra Large-Scale Integrated (ULSI) devices. For ULSI devices the target device feature size is now in the micron and sub-micron range where there is development work taking place relating to deep sub-micron sizes that reach below 0.5 um. The attainment of the sharp reduction in device feature sizes has mainly been accomplished with gradual but significant advances in supporting technologies such as photolithography and improved etching techniques such as Reactive Ion Etching (RIE). These developments have been taking place concurrent with improvements in photo-imaging techniques and advancements in exposure methods and the wavelengths of the exposure sources that now reach into the Deep Ultra Violet range. Special techniques such as the application of special layers of material further improve focusing depth and sharpness of focus in creating images in for instance layers of photoresist that are applied to create interconnect lines, vias, contact openings and the like. These techniques are equally applied in the formation of for instance Complementary Metal Oxide Semiconductor (CMOS) devices.

Further reductions in device dimensions have been made possible by the development of more sensitive photoresist materials as well as the rapid development of anisotropic dry etching procedures. These latter two-developments have allowed for the successful transfer of mask images to underlying layers and the successful etching of these layers with very small dimensions of feature size or feature separation. Further major contributors to the downsizing of semiconductor devices have been the development of Low Pressure Chemical Vapor Deposition (LPCVD) and the development of ion implantation that allows for very fine feature size.

Concurrent with the improvements in the method to fabricate semiconductor devices must come improvements in interconnecting these devices. These methods of interconnecting frequently involve interconnecting overlying layers of metal where openings with sizes down to 0.25 and 0.50 micrometers are used. Vias that have such small dimensions offer their own reliability challenges where the materials that are selected to create the via and the connected metal lines are of great concern. While aluminum has mostly been used for interconnecting metal lines, this material poses problems of electromigration and problems of penetration. Alternate methods and materials for metal line formation together with materials that are used for plug fill are being investigated.

The technique of creating complementary n-channel and p-channel devices has long been known and applied in the semiconductor industry. The salient advantage of these devices is their low power usage due to the fact that two transistors are paired as complementary n-channel and p-channel transistors whereby in either logic state (on/off) of the device, one of the two transistors is off and negligible current is carried through this transistor. The logic elements of Complementary Metal Oxide (CMOS) devices drain significant amounts of current only at the time that these devices switch from one state to another state. Between these transitions the devices draw very little current resulting in low power dissipation for the CMOS device.

Referring now specifically to FIGS. 1a through 1e, there is shown a cross section of a typical gate electrode of a CMOS device and its surrounding area. The gate electrode is constructed on the surface of a monocrystalline silicon preferably having a crystal orientation of <100>, the background substrate dopant is of first conductivity type and preferably p-type, preferably with boron impurity with a concentration in the range of about 5E15 and 5E17 atoms/$cm^3$.

Figure 1A:
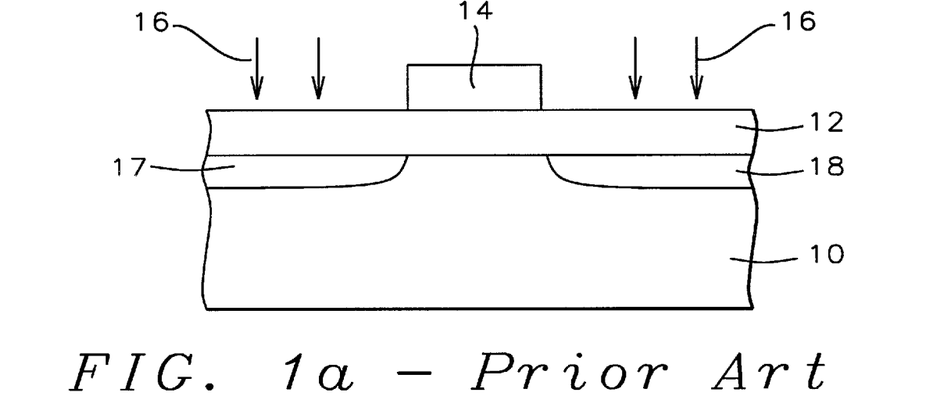
FIG. 1a shows a cross section of a substrate over which a layer of gate oxide has been grown and a poly gate structure has been created, initial source/drain regions have been implanted

FIG. 1a shows a cross section of the gate electrode 14 of a NMOS device on the surface of a silicon substrate 10. A layer of gate oxide 12 has been created over the surface of substrate 10, via thermal oxidation at a temperature between about 850 and 950 degrees C. to a thickness of between about 70 and 850 Angstrom. A layer 14 of polysilicon is deposited using LPCVD at a temperature between about 550 and 700 degrees C., to a thickness between about 2000 and 4000 Angstrom. The layer 14 of polysilicon is provided with the required conductivity by an ion implant procedure, using phosphorous as a source at an energy between about 50 and 100 KeV with a does between about 1E13 and 5E15 atoms/$cm^2$. Standard methods of patterning and RIE etching are applied using $SF_6$ as an etchant to form the gate electrode 14.

P-type implant 16 forms deep doped regions 17 (the source region) and 18 (the drain region) in the surface of the substrate 10, these regions are (due to the masking effect of the poly layer 14) self-aligned with the gate electrode 14. Dopant concentrations in regions 17 and 18 are higher than the dopant concentrations in the surrounding substrate 10.

Figure 1B:
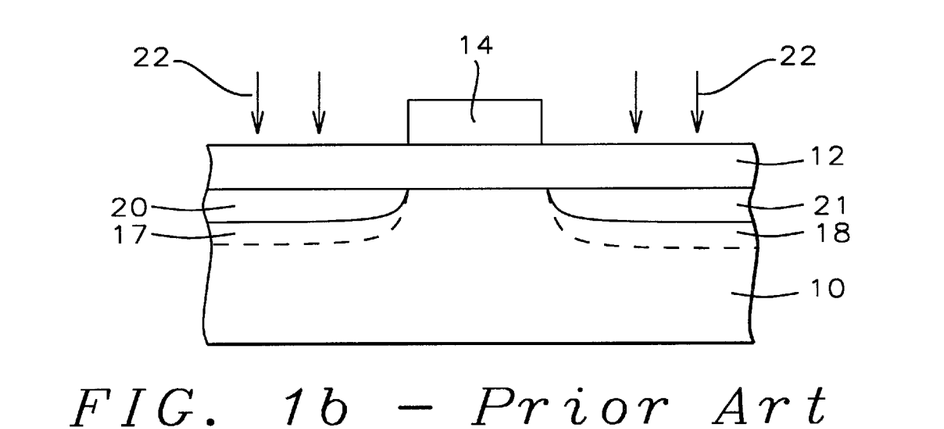
FIG. 1b shows a cross section of the gate electrode with the LDD implant

FIG. 1b shows the lightly doped (LDD) regions 20 and 21 are formed by performing for instance an N-type implant 22 into substrate 10. This N-type implant has a shallower junction depth and a higher dopant concentration than the previously implanted regions 17 and 18 (FIG. 1a). As examples of LDD implants can be mentioned an NMOS implant using arsenic with an energy within the range of between 1 to 10 keV and a dose within the range of between 1e14 to 1e16 atoms/$cm^2$. Further can be mentioned an PMOS implant using $BF_2$ with an energy within the range of between 1 to 10 keV and a dose within the range of between 1e14 to 5e15 atoms/$cm^2$.

Figure 1C:
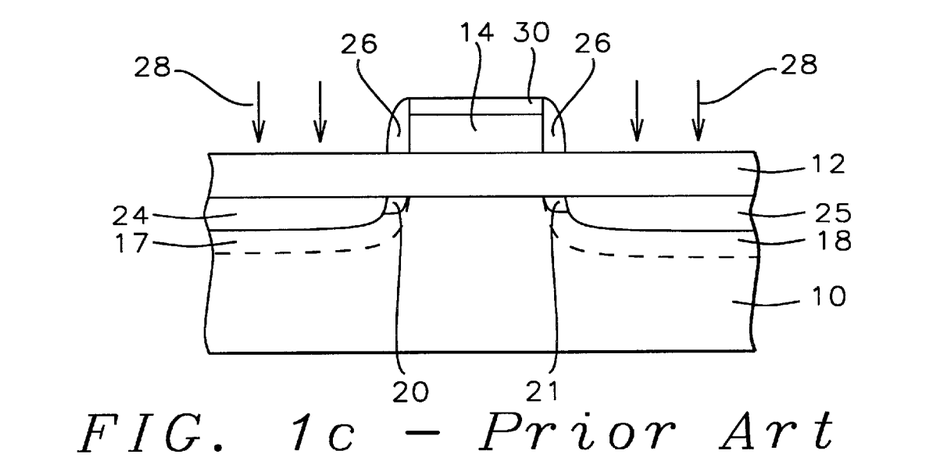
FIG. 1c shows a cross section of the gate electrode with the final implant for the source/drain regions

FIG. 1c shows the formation of gate spacers 26 on the sides of the gate electrode 14. This is performed using another LPCVD process, using tetraethylorthosilicate as a source, to deposit a silicon layer 26 at a temperature between about 500 and 700 degrees C. to a thickness between about 2000 and 4000 Angstrom. Anisotropic selective RIE processing using $CH_4$ and $H_2$ as etchants is used to create the silicon oxide sidewall spacers 26. By performing implant 28 the heavily doped regions 24 and 25 are created in the substrate 10. Silicide layers are created over the surface of the source/drain regions 24 and 25 (not shown) and on the top surface 30 of the gate electrode 14. These silicide layers are, as previously indicated, used to interconnect the gate electrode and to connect the gate electrode to surrounding circuitry.

Silicides are often used to reduce contact resistance. For very small modern silicon devices, which are sub-micron, sub-half-micron, and even sub-quarter-micron, conventional photolithographic technique for patterning contacts will not meet the required tolerance of critical dimensions. The method of self-aligned silicide (salicide) formation, which self-registers with the contacts at the top of the polysilicon gate, the source and the drain, helps solve the problem of critical dimension tolerance. Salicides have thus become almost universal in today's high-density MOSFET (Metal-Oxide-Semiconductor Field-Effect Transistors) devices even though the gate metal is now prevalently replaced by the polysilicon gate. Metal silicide can be tungsten silicide deposited using LPCVD, at a temp. between 400 and 600 degrees C. to a thickness between 1000 and 2000 Angstrom and can be titanium silicide formed by depositing PVD titanium and annealing to form thin layers of titanium silicide ($TiSi_2$) over the polysilicon gate and the source/drain regions in a temperature range of between 600 and 700 degrees C. for a time of between 20 and 40 seconds and then rapid thermal annealing in a temperature of between about 800 and 900 degrees C. for a time between 20 and 40 seconds.

Figure 1D:
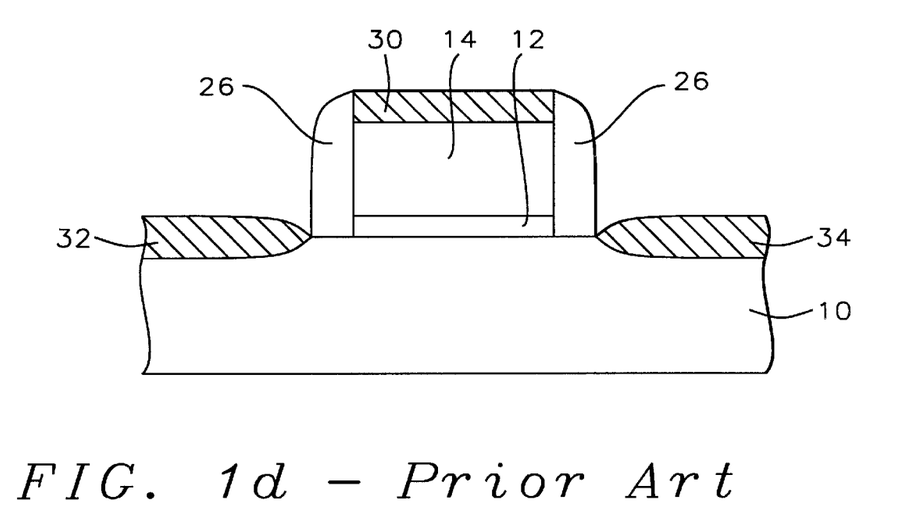
FIG. 1d shows a cross section of the gate electrode with silicided source/drain regions and gate contact

FIG. 1d shows a cross section of the gate electrode with the silicide contact regions 32 and 34 for the source and drain regions respectively. The doping of the source/drain regions is not shown in FIG. 1d for reasons of clarity. Silicide layer 30 on the top surface of the gate electrode 14 is also highlighted in FIG. 1d.

Figure 1E:
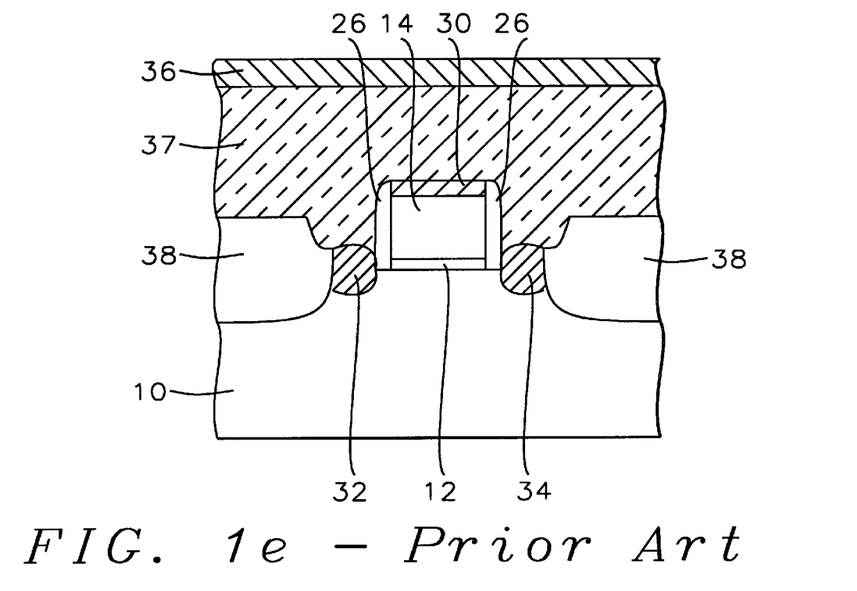
FIG. 1e shows a cross section of the gate electrode with a layer of dielectric deposited over which a layer of metal has been deposited

FIG. 1e shows a cross section of the gate electrode after the contact layers of silicide have been formed, a layer of dielectric has been deposited over the gate electrode while a layer of metal has been formed on the surface of the layer of dielectric. The doping of the source/drain regions is not shown in FIG. 1e for reasons of clarity. Shallow Trench Isolations (STI) regions 38 bound the active region of the gate electrode on the surface of the substrate 10. The gate oxide layer 12 is located under the gate poly layer 14. A silicide layer 30 is created to establish electrical contact with the gate electrode, silicide layers 32 and 34 are created for making electrical contact to the source and drain regions respectively. A layer 37 of dielectric has been deposited over the gate electrode and the surrounding STI regions 38, electrical contacts can be established between the silicide layers and, for instance, a layer 36 of metal conductor, by patterning and etching an opening through the layer 37 of dielectric and filling this opening with metal. This electrical contact has not been shown is FIG. 1e.

To avoid damage to the gate oxide caused by plasma etch for poly gate contacts, the contacts to the polysilicon gates are typically placed on contacting pads (landing pads) that are located outside the active area of the MOS device. This placement requires substrate surface area and therefore reduces MOS device density. The invention addresses this concern by providing a method where the contact pad to the polysilicon gate can be placed inside the active area and therefore increases the packaging density of MOS devices.

SUMMARY OF THE INVENTION

A principle objective of the invention is to provide a contact structure that allows for the contact to be placed inside the active area of the device while not causing plasma etch damage.

Another objective of the invention is to provide a method of creating contact pads for active devices such that no space is used outside the active areas of the devices.

Yet another objective of the invention is to provide a method for forming MOS device contact pads that do not infringe on device density.

In accordance with the objectives of the invention a new method is provided for the creation of contact pads to the poly gate of MOS devices. The invention contains two embodiments; the initial processing steps under the two embodiments are identical. STI regions are formed in the surface of a substrate; a layer of gate oxide is deposited on the surface of the substrate over which a layer of poly is deposited over which a layer of SiN is deposited. The poly gate is patterned and etched leaving a layer of SiN on the surface of the gate. An oxide liner is deposited over the surface of the gate. LDD implant is performed, the gate spacers are created after which the source/drain region implants are performed. A layer of titanium is deposited over the surface of the gate and the surrounding surface of the substrate and annealed, a salicide etchback is performed to the layer of titanium creating silicided surfaces over the source and drain regions. A layer of inter level dielectric (ILD) is deposited over the gate including the surface of the surrounding substrate, the layer of ILD is polished down to the SiN layer on the top surface of the gate. The layer of SiN is removed from the top surface of the gate creating a recessed gate structure. At this point in the processing sequence, the processes of the invention diverge into a first and a second embodiment of the invention.

Under the first embodiment of the invention, a three level layer of successively titanium followed by amorphous silicon followed by titanium (Ti/Si/Ti) is deposited over the layer of ILD thereby including and filling the recess on top of the gate with Ti/Si/Ti. This three level layer is patterned and etched forming a Ti/Si/Ti stack that partially overlays the layer of ILD while also penetrating the recessed opening of the gate electrode. This three level layer is silicided and forms the contact pad to the gate structure.

Under the second embodiment of the invention, a layer of tungsten silicon ($WSi_x$) is deposited over the layer of ILD thereby including and filling the recess on top of the gate with $WSi_x$. This layer is patterned and etched forming a layer of $WSi_x$ over the layer of ILD that also penetrates the recessed opening of the gate electrode. This layer of $WSi_x$ forms the contact pad to the gate structure.

BRIEF DESCRIPTION OF THE DRAWINGS

FIG. 1 shows a Prior Art formation of a polysilicon gate electrode, as follows:

DESCRIPTION OF THE PREFERRED EMBODIMENTS

Figure 2:
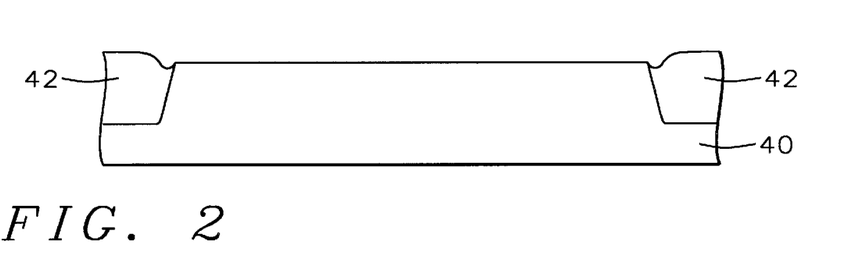
FIG. 2 shows a cross section of a semiconductor surface into which Shallow Trench Isolation regions have been formed.

Referring now specifically to FIG. 2, there is shown a cross section of a semiconductor surface 40 into which Shallow Trench Isolation regions 42 have been formed. The semiconductor surface 40 is typically the surface of a single crystalline silicon substrate with a crystal orientation of <100>. The Shallow Trench Isolation (STI) regions 42 are typically used in creating MOSFET devices to reduce or eliminate leakage currents between or around the periphery of these devices.

STI can be made using a variety of methods. For instance, one method is the Buried Oxide (BOX) isolation used for shallow trenches. The method involves filling the trenches with a chemical vapor deposition (CVD) silicon oxide ($SiO_2$) and then etched back or mechanically or chemically polished to yield a planar surface. The shallow trenches etched for the BOX process are anisotropically plasma etched into the silicon substrate and are typically between 0.2 and 0.5 micrometer (um.) deep. STI are formed around the active device to a depth between 2000 and 5000 Angstrom.

Another approach in forming STI is to deposit silicon nitride on thermally grown oxide. After deposition of the nitride, a shallow trench is etched into the substrate using a mask. A layer of oxide is then deposited into the trench so that the trench forms an area of insulate dielectric which acts to isolate the devices in a chip and thus reduce the cross talk between active devices. The excess deposited oxide must be polished off and the trench planarized to prepare for the next level of metalization. The silicon nitride serves as a stopping layer for the CMP polishing.

Figure 3:
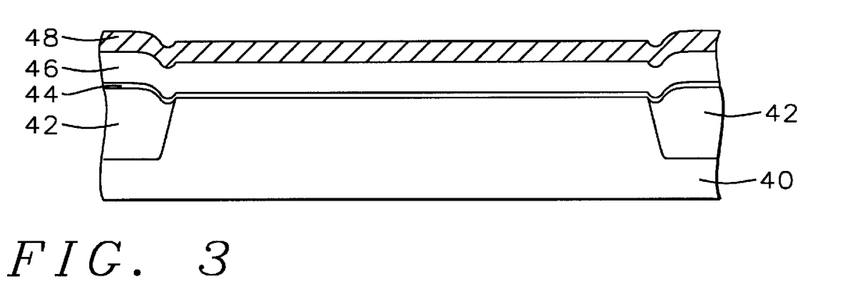
FIG. 3 shows a cross section of the semiconductor surface after a layer of oxide, a layer of polysilicon and a layer of SiN have been deposited over the surface of the substrate.

FIG. 3 shows a cross section of the substrate 40 after a layer 44 of gate oxide, a layer 46 of polysilicon and a layer 48 of SiN have been deposited over the surface of substrate 40. The layer 44 of gate oxide is a thin thermal oxide, which allows better adhesion between the overlying layers (for instance polysilicon) and the (underlying) silicon and acts as a stress relaxation layer. Gate oxide can be formed by thermal oxidation of the underlying silicon and can also be formed in conjunction with a deposited oxide layer, nitride layer or any other material suitable for use as a gate dielectric. Gate oxide is usually formed as a silicon dioxide material but may be a composite oxide, such as TEOS and silicon dioxide, or a nitride oxide layer or a like gate dielectric.

A gate oxide layer can for instance be grown in an oxidation steam ambient at a temperature between about 850 and 1000 degrees C. to a thickness between about 30 and 250 Angstrom.

The layer 46 of polysilicon can be grown at a temperature between 600 and 640 degrees C. using LPCVD to a thickness of between about 2000 and 4000 Angstrom.

The layer 48 of silicon nitride ($Si_3Ni_4$) can be deposited using LPCVD or PECVD procedures at a pressure between about 200 mTorr and 400 mTorr, at a temperature between about 600 and 800 degrees C., to a thickness of between about 1500 and 3000 Angstrom using $NH_3$ and $SiH_4$ or $SiCl_2H_2$. The silicon nitride layer 48 can also be deposited using LPCVD or PECVD procedures using a reactant gas mixture such as dichlorosilane ($SiCl_2H_2$) and ammonia ($NH_3$).

Figure 4:
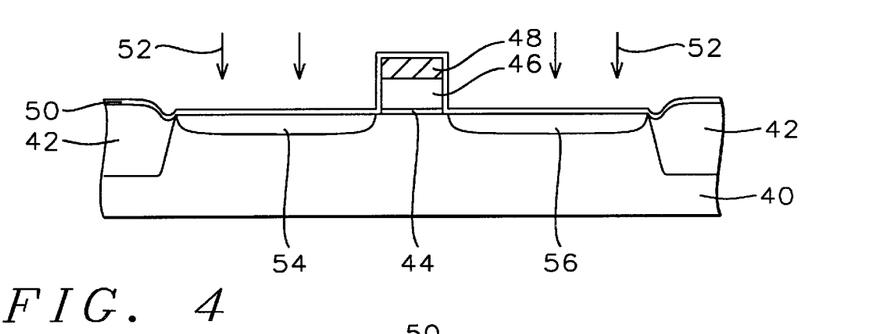
FIG. 4 shows a cross section of the semiconductor surface after the gate electrode structure of poly/SiN has been etched, after an oxide liner has been created and after LDD implant.

FIG. 4 shows a cross section of the substrate 40 after the poly gate 46/48 of poly/SiN has been etched, after an oxide liner 50 has been created and after LDD implant 52 has been performed. The etching of the poly gate structure uses conventional photolithographic and RIE processing and an $SF_6$ chemistry. Another LPCVD process, using tetraethylorthosilicate as a source, is used to deposit the silicon oxide layer 50 at a temperature between about 500 and 700 degrees C. to a thickness between about 50 and 200 Angstrom.

The LDD implant 52 forms the lightly doped regions 54 (for the source) and 56 (for the drain) of the MOS devices. The LDD implant 52 can by performed using processing conditions that are determined by the type of device that is being created. For instance, if the device is a NMOS device, the implant uses arsenic or phosphorous with an energy within the range of between 5 to 60 keV and a dose within the range of between 1E15 to 5E15 atoms/$cm^2$. If the device is a PMOS device, the LDD implant uses $BF_2$ with an energy within the range of between 1 to 30 keV and a dose within the range of between 1E13 to 5E14 atoms/$cm^2$.

Figure 5:
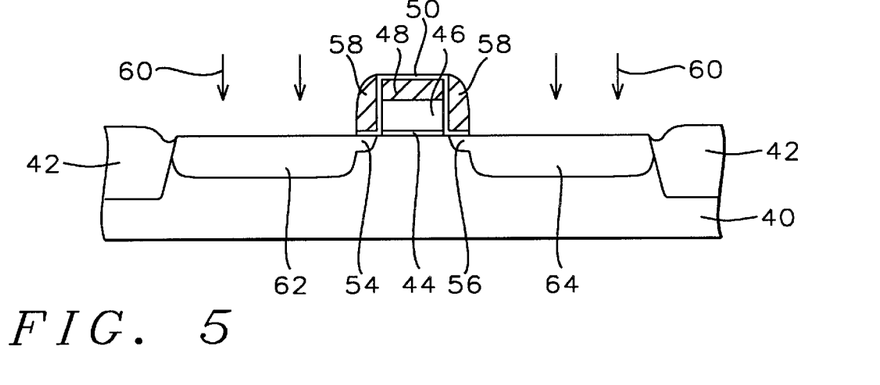
FIG. 5 shows a cross section of the semiconductor surface after oxide spacers have been formed and after source/drain implant has been completed.

FIG. 5 shows a cross section of the semiconductor surface after $S_iO_2$ spacers 58 have been formed and after source/drain implant 60 has been completed. Spacers for gate electrodes can be made using a variety of materials such as silicon oxide, BSG, PSG, other materials preferably of a dielectric nature, CVD oxide formed from a TEOS source. The preferred material of the invention is silicon dioxide ($S_iO_2$) that is deposited over the surface of the layer 50 of oxide liner using LPCVD procedures (for better step coverage) at a pressure between about 200 mTorr and 800 mTorr, at a temperature between about 600 and 800 degrees C., to a thickness between about 1000 and 2000 Angstrom using TEOS. The silicon oxide layer 50 can also be deposited using LPCVD procedures using a reactant gas mixture such as dichlorosilane ($SiCl_2H_2$) and $O_2$. The silicon oxide spacers 58 are formed via anisotropic RIE of the deposited layer of silicon oxide layer, using $CHF_3CF_4$ or $SF_6$—$O_2$ as an etchant.

The source and drain implant 60 creates the source region 62 and the drain region 64 of the gate electrode 46/48. Source and drain implants can also be made under different processing conditions that are dependent on the requirements for the device that is being created. For instance a first conductivity imparting dopant using phosphorous can be implanted to create a lightly doped source and drain regions, ion implanted at an energy between about 5 to 60 KeV, at a dose between about 1E12 to 1E14 atoms/cm$^2$. A second conductivity imparting dopant can be used to create medium doped source and drain regions, such as arsenic or phosphorous, ion implanted at an energy between about 5 to 60 KeV, at a dose between about 1E13 to 5E14 atoms/cm$^2$. A third conductivity imparting dopant can be used to create heavily doped source and drain regions, such as arsenic, ion implanted at an energy between about 5 to 60 KeV, at a dose between about 1E15 to 5E15 atoms/cm$^2$.

Figure 6:
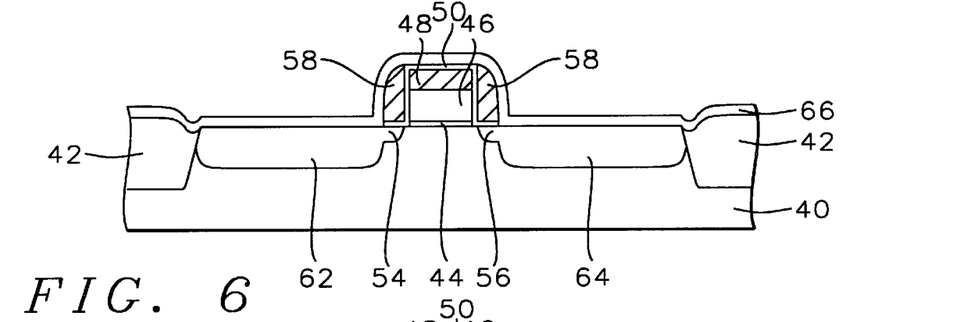
FIG. 6 shows a cross section of the semiconductor surface after a layer of titanium has been deposited and first annealed.

FIG. 6 shows a cross section of the substrate 40 after a layer 66 of titanium has been deposited and annealed.

Titanium is deposited on the exposed upper surfaces of the source/drain regions 62 and 64 and the top surface of SiN of the gate region 48 and annealed, thereby causing the titanium to react with the underlying silicon of the substrate source/drain regions 62 and 64 to form titanium salicide on these surfaces. The layer 66 of titanium can be deposited on the surface of the substrate to a thickness between about 25 to 350 A$^0$ at a temperature of 25 to 300 degrees C. using either rf. sputtering or CVD techniques.

The first anneal that is performed to the layer 66 of titanium is a rapid thermal annealing in a temperature range of between about 600 and 800 degrees C. for a time between about 20 and 40 seconds in a nitrogen ambient.

Figure 7:
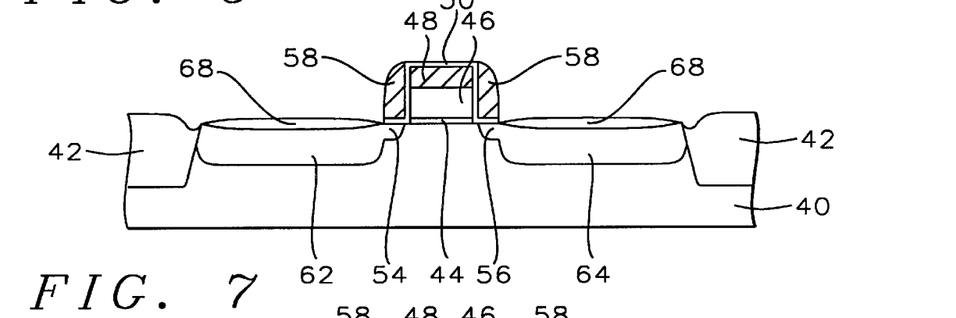
FIG. 7 shows a cross section of the semiconductor surface after the layer of titanium has been etched back and second annealed.

FIG. 7 shows a cross section of the substrate after the layer 66 of titanium has been etched and a second anneal has been applied to the etched back layer of salicide that has been formed during the first anneal of FIG. 6.

The layer 66 of titanium can be removed with an etchback using a wet $NH_4OH$ and $H_2O_2$ solution. A CVD titanium may also be etched using a dry $CF_4$ and oxygen environment.

The second anneal to transform layers 68 of titanium silicide ($TiSi_2$) over the source/drain regions from the high resistivity phase to the low resistivity phase is a rapid thermal anneal in a temperature range of between about 800 and 900 degrees C. for a time between 20 and 40 seconds in an $N_2$ ambient.

Figure 8:
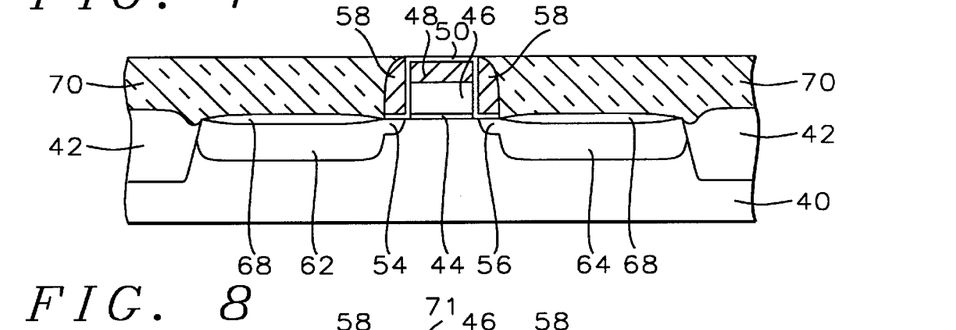
FIG. 8 shows a cross section of a semiconductor surface after a layer of Inter Level Dielectric has been deposited and polished.

FIG. 8 shows a cross section of a substrate after a layer 70 of Inter Level Dielectric (ILD) has been deposited.

As dielectric material can be used any of the typically applied dielectrics such as silicon dioxide (doped or undoped), silicon oxynitride, parylene or polyimide, spin-on-glass, plasma oxide or LPCVD oxide. The material that is used for the deposition of layer 70 of ILD of the invention is not limited to the materials indicated above but can include any of the commonly used dielectrics in the art.

A typical application of a layer of ILD is depositing a layer of $SiO_2$ using CVD technology at a temperature of between about 400 and 800 degrees C. The layer 70 of ILD is deposited to a thickness that is adequate to cover the gate spacers 58 and to (slightly) extend above the top surface of the gate electrode 46/48. The layer 70 is, after it has been deposited, polished using CMP technology down to the surface of the layer 48 of SiN that forms the top layer of the gate electrode 46/48.

Figure 9:
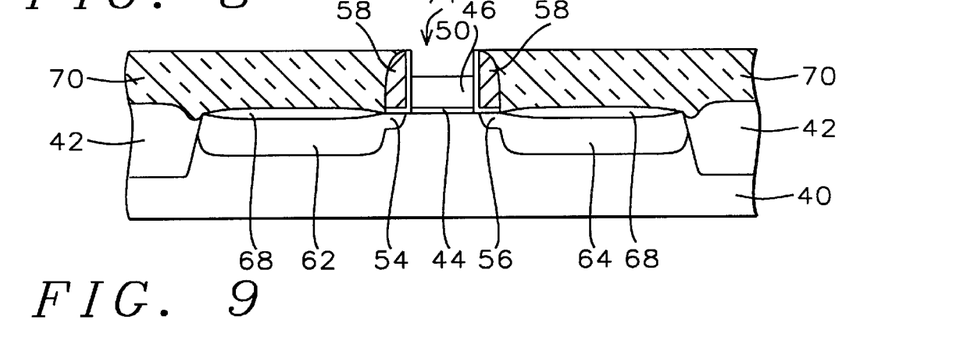
FIG. 9 shows a cross section of the semiconductor surface after the SiN has been removed from the top of the gate electrode.

FIG. 9 shows a cross section of the substrate after the layer 48 of SiN has been removed from the top of the gate electrode. The silicon nitride layer 48 can be removed via anisotropic RIE using $CHF_3$ or $SF_6$—$O_2$ as an etchant, but is preferably removed applying an isotropic wet etch process using hot phosphoric acid. The removal of the layer 48 of SiN creates a recess or opening 71 in the top surface of the gate electrode.

Figure 10:
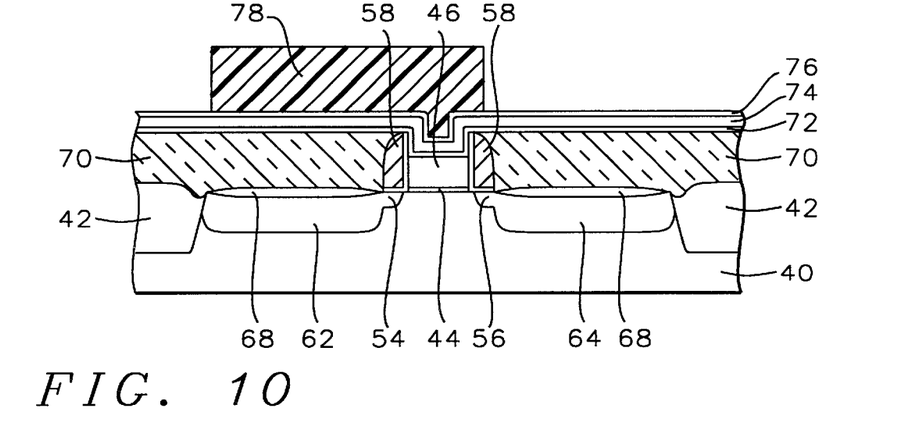
FIG. 10 shows a cross section of the semiconductor surface of the first embodiment of the invention after a stack of layers of Ti/Si/Ti has been deposited and masked.
Figure 11:
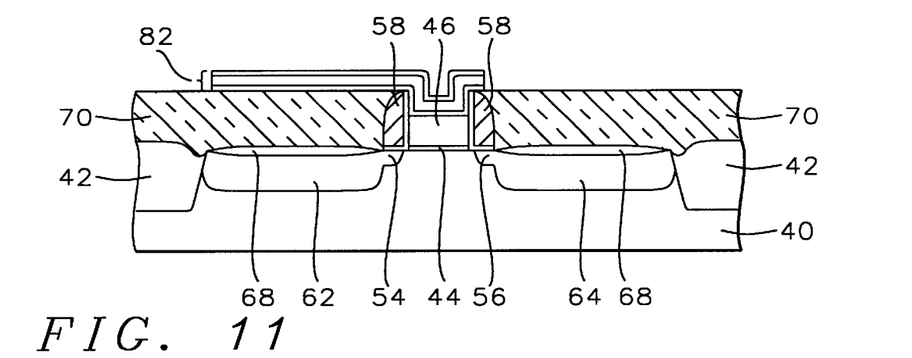
FIG. 11 shows a cross section of the semiconductor surface of the first embodiment of the invention after the layers of Ti/Si/Ti have been etched.
Figure 12:
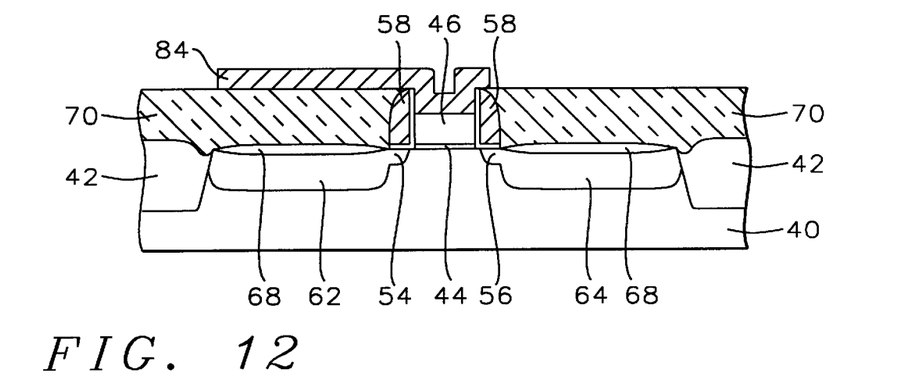
FIG. 12 shows a cross section of the semiconductor surface of the first embodiment of the invention after the layers of Ti/Si/Ti have been silicided.

At this point in the processing sequence of the invention, the sequence branches into the first and the second embodiment of the invention. FIGS. 10 through 12 address the first embodiment of the invention while FIGS. 13 and 14 address the second embodiment of the invention.

Referring now to FIG. 10, there is shown a cross section of the substrate of the first embodiment of the invention after a stack of layers of Ti/Si/Ti has been deposited and masked. The three layers are deposited in the sequence that is reflected in FIG. 10, that is first a layer 72 of titanium is deposited over the surface of the layer 70 of ILD thereby including the opening 71, after this a layer 74 of amorphous silicon is deposited over the surface of the layer 72 of titanium, after this a layer 76 of titanium is deposited over the layer 74 of amorphous silicon.

The two layers of titanium, that is layers 72 and 76, can be deposited on the surface of the substrate to a thickness between about depositing 300 to 600 A$^0$ at a temperature of 25 to 300 degrees C. using either rf. sputtering or CVD techniques.

The layer 74 of amorphous silicon can be grown by using, for instance, $Si_2H_6$ gas and $N_2$ gas with flow rates of between about 60 to 100 sccm and 200 to 240 sccm respectively using LPCVD technology at a temperature of between about between 480 to 590 degrees C. and a pressure between about 0.2 and 0.3 Torr grown to a thickness of between about 200 and 500 Angstrom.

A layer 78 of photoresist is deposited over the layer 76 of titanium and patterned and etched using standard procedures of photolithography and photoresist etch and ashing followed by a thorough rinse. The photoresist mask that is created in this manner covers the surface of layers 72/74/76 where these layers penetrate the recess 71 of the gate electrode. The area covered by the photoresist extends by a measurable distance over the area that is adjacent to and as a continuation of the three layers that are deposited inside the recess 71 of the gate.

FIG. 11 shows a cross section of the substrate of the first embodiment of the invention after the layers 72/74/76 of Ti/Si/Ti have been etched.

The etch of the layers 72/74/76 of Ti/Si/Ti can be a dry Cl based environment. This etch can also be performed using a dry $CF_4$ and oxygen environment. The etch back of the layers 72/74/76 of Ti/Si/Ti results in Ti/Si/Ti deposition 82 over the surface of the layer 70 of ILD whereby this deposition of Ti/Si/Ti further makes contact with the surface of the gate electrode 46.

The cross section that is shown in FIG. 11 highlights that the layers of Ti/Si/Ti remain in place inside the opening 71 of the recess of the gate electrode and in an area that extends from this opening. This extension of the layers away from the opening 71 provides a surface of a metal connect to the gate electrode that can be used to connect to the gate electrode.

FIG. 12 shows a cross section of the semiconductor surface of the first embodiment of the invention after the layers 72/74/76 of Ti/Si/Ti have been silicided forming metal silicide layer 84. Layer 84 of Ti/Si/Ti can become TiSi2 by an anneal at a temperature between about 800 and 900 degrees C. for between 30 and 60 minutes to form the layer 84 of Ti silicide to a thickness between about 1000 and 2000 Angstrom.

Figure 13:
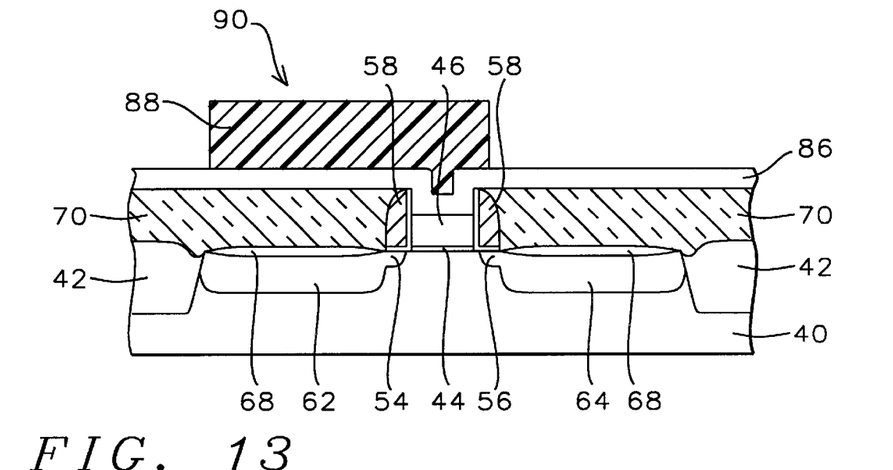
FIG. 13 shows a cross section of the semiconductor surface of the second embodiment of the invention after a layer of $WSi_x$ has been deposited and masked.
Figure 14:
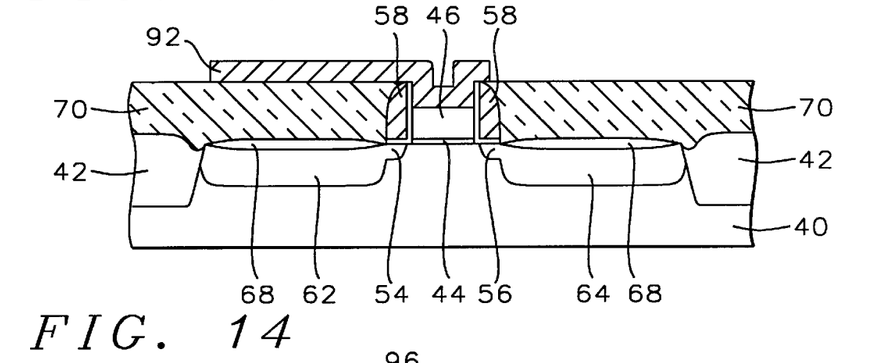
FIG. 14 shows a cross section of the semiconductor surface of the second embodiment of the invention after the layer of $WSi_x$ has been etched.

FIGS. 13 and 14 address the second embodiment of the invention where this second embodiment of the invention deviates from the processing steps that are common to both the first and the second embodiment of the invention.

Referring now to FIG. 13, there is shown a cross section of the substrate 40 of the second embodiment of the invention after a layer 86 of WSi$_x$ has been deposited and masked, whereby x=2.7 before anneal and equals 2.2 after a 750 degrees C. anneal.

The layer 86 of WSi$_x$ can be deposited on the surface of the substrate to a thickness between about depositing 1000 to 2000 A$^0$ at a temperature of 400 to 600 degrees C. using CVD techniques.

A layer 88 of photoresist is deposited over the layer 86 of WSi$_x$ and patterned and etched using standard procedures of photolithography and photoresist etch and ashing followed by a thorough rinse. The photoresist mask that i s created in this manner covers the surface of layer 86 where this layer penetrates the recess 71 of the gate electrode. The area under the photoresist extends over a measurable distance adjacent to and as a continuation of the layer 86 that is deposited inside the recess 71 of the gate.

FIG. 14 shows a cross section of the substrate of the second embodiment of the invention after the layer 86 of WSi$_x$ has been etched.

The etch of the layer 86 of WSi$_x$ can be a Cl$_2$ plasma etch. The etch of the layer 88 of WSi$_x$ results in WSi$_x$ deposition 92 over the surface of the layer 70 of ILD that further makes contact with the surface of the gate elect rode 46.

The cross section that is shown in FIG. 14 highlights that the layer 92 of WSi$_x$ remains in place inside the opening 71 of the recess of the gate electrode and in an area that extends from this opening. This extension of the layer 92 away from the opening 71 provides a surface of a metal connect to the gate electrode that can be used to connect to the gate electrode. The layer 92 of WSi$_x$ has a thickness between about 1000 and 2000 Angstrom.

Figure 15:
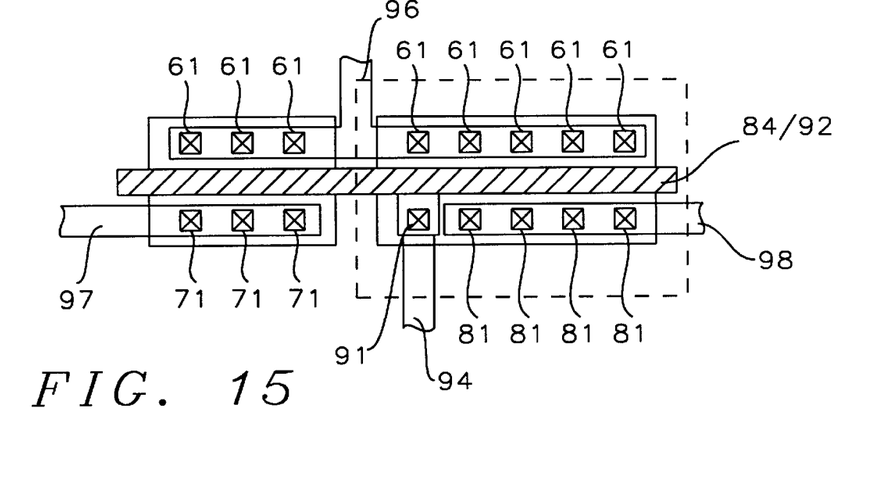
FIG. 15 shows a top view of the semiconductor surface after the gate contact of the invention has been formed.

FIG. 15 shows a top view of the contact of the invention and it's surrounding area. Highlighted as 84/92 is the contact bar of the invention that connects to the gate electrode. The point of contact where the gate electrodes are connected to surrounding circuitry is point 91; input connection 94 is the connection to the surrounding circuitry. The drain regions of the gate electrodes are highlighted as 61; the source regions of the gate electrodes are highlighted as 71 and 81. The drain regions 61 are connected to the output terminal 96 of the gate electrodes, source regions 71 are connected to ground terminal 97 while source regions 81 are connected to supply voltage V$_{dd}$.

The top view that is shown in FIG. 15 clearly demonstrates that the point of contact, that is point 91, is contained within the active area of the gate electrodes and therefore allows for increased density of the gate electrodes structure.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating MOS devices with salicided gate and source and drain, comprising the steps of:

providing a semiconductor substrate whereby a recessed gate electrode structure has been created on the surface of said substrate whereby said gate electrode is surrounded by a layer of Inter Level Dielectric (ILD);

depositing a composite layer of a first layer of Ti followed by a layer of amorphous Si followed by a second layer of Ti over the surface of said substrate thereby including the surface of said recessed gate electrode;

patterning and etching said composite layer of Ti/Si/Ti thereby creating a strip of Ti/Si/Ti overlaying said layer of ILD whereby said strip of Ti/Si/Ti contacts the top surface of said gate electrode and extends from said gate electrode by a measurable amount; and saliciding said layer of Ti/Si/Ti thereby providing a low resistivity contact to said top surface of said gate electrode.

2. The method of claim 1 wherein said creation of said recessed gate electrode structure comprises the steps of:

providing a semiconductor substrate;

forming a pattern of active regions in the surface of said substrate;

thermally growing a gate base layer on the surface of said substrate over said active area whereby said base gate layer serves as a stress relieve layer between said gate structure and said substrate;

depositing a layer of gate electrode material over the surface of said gate base layer;

depositing a layer of gate contact material over the surface of said gate electrode material;

patterning and anisotropically ion etching said layer of gate contact material and said layer of gate electrode material and said gate base layer material thereby forming said gate electrode structure that is overlaid with said gate contact material;

depositing a liner over the surface of said gate and said active region;

performing a self-aligned LDD implant into the surface of said substrate;

depositing a layer of gate spacer material over said layer of liner;

forming gate spacers on the sidewalls of said gate; performing a self-aligned source/drain implant into the surface of said substrate;

depositing a layer of material that can be salicided over said gate and the surface of said substrate;

performing a rapid thermal anneal of said layer of salicidable material to form suicides;

performing an etchback of said silicides thereby leaving thin layers of suicides over the surface of said source and drain regions;

performing a rapid thermal anneal of said thin layers of silicide over the surface of said source and drain regions thereby forming low resistivity silicide layers over the surface of said source and drain regions;

depositing a layer of inter level dielectric over the surface of said substrate;

polishing said layer of inter level dielectric down to the surface of said layer of gate contact material of said gate electrode; and removing said layer of gate contact material from said gate thereby creating said recessed gate.

3. The method of claim 1 wherein said first layer of titanium has a thickness between about 300 and 600 angstrom.

4. The method of claim 1 wherein said layer of amorphous silicon has a thickness between about 300 and 600 angstrom.

5. The method of claim 1 wherein said second layer of titanium has a thickness between about 300 and 600 angstrom.

6. The method of claim 1 wherein said saliciding said patterned layer of titanium-silicon-titanium is performed at a temperature between about 800 and 900 degrees C. for between 30 and 60 minutes to form a layer of Ti/Si/Ti silicide to a thickness between about 1000 and 2000 Angstrom.

7. A method of creating MOS devices with salicided gate and source and drain, comprising the steps of:

providing a semiconductor substrate;

forming a pattern of active regions on the surface of said substrate;

growing a layer of gate base material on the surface of said substrate in said active area whereby said gate layer of gate base material serves as a stress relieve buffer between said gate electrode and the underlying silicon substrate;

depositing a layer of gate electrode material over the surface of said substrate;

depositing a layer of gate contact material over the surface of said gate electrode material;

masking and anisotropically etching said layer of gate contact material and said layer of gate electrode material and said layer of gate base material to form a gate electrode structure overlaid by a layer of gate contact material;

depositing a liner over the surface of said gate electrode and said active regions;

performing a self-aligned LDD implant into the surface of said substrate;

depositing a layer of gate spacer material over said layer of oxide liner;

forming gate spacers on the sidewalls of said gate;

performing a self-aligned source/drain implant into the surface of said substrate;

depositing a layer of salicidable material over said gate and the surface of said substrate;

performing a rapid thermal anneal of said layer of salicidable material to form reacted and unreacted suicides;

performing an etchback of said unreacted silicides thereby leaving a thin layer of reacted silicides over the surface of said source and drain regions;

performing a rapid thermal anneal of said thin layer of high resistivity reacted silicide over the surface of said source and drain regions thereby forming low resistivity silicide layers over the surface of said source and drain regions;

depositing a layer of inter level dielectric over the surface of said substrate;

polishing said layer of inter level dielectric down to the surface of said layer of gate electrode contact material;

removing said layer of gate contact material from said gate thereby creating a recessed gate;

depositing a first layer of titanium followed by a layer of amorphous silicon followed by a second layer of titanium over the surface of said polished layer of inter level dielectric thereby including said recess in said gate thereby forming a triple layer of titanium-silicon-titanium;

patterning said triple layer of titanium-silicon-titanium whereby said patterning exposes said layer of titanium-silicon-titanium in a pattern that is the mirror image of said layer of titanium-silicon-titanium above the surface of said gate electrode thereby including an extension of said layer of titanium-silicon-titanium that is contiguous with and extends from said layer of titanium-silicon-titanium above the surface of said gate electrode;

etching said layer of titanium-silicon-titanium in accordance with said pattern thereby leaving said layer of titanium-silicon-titanium in place above the surface of said gate whereby said etching furthermore leaves in place said layer of titanium-silicon-titanium over a region that is contiguous with and extends from said layer of titanium-silicon-titanium in place above the surface of said gate; and siliciding said patterned layer of titanium-silicon-titanium.

8. The method of claim 7 wherein said layer of gate contact material has a thickness between about 1500 and 3000 Angstrom.

9. The method of claim 7 wherein said layer of salicidable material has a thickness between about 250 and 350 Angstrom for salicide formation.

10. The method of claim 7 wherein said first layer of titanium has a thickness between about 300 and 600 angstrom.

11. The method of claim 7 wherein said layer of amorphous silicon has a thickness between about 300 and 600 angstrom.

12. The method of claim 7 wherein said second layer of titanium has a thickness between about 300 and 600 angstrom.

13. The method of claim 7 wherein said amorphous silicon is deposited by low-pressure chemical vapor deposition.

14. The method of claim 7 wherein said amorphous silicon is deposited by sputtering.

15. The method of claim 7 wherein said siliciding said patterned layer of titanium-silicon-titanium is performed at a temperature between about 800 and 900 degrees C. for between 30 and 60 minutes to form a layer of Ti/Si/Ti silicide to a thickness between about 1000 and 2000 Angstrom.

16. A method of creating MOS devices with salicided gate and source and drain, comprising the steps of:

providing a semiconductor substrate whereby a recessed gate electrode structure has been created on the surface of said substrate;

depositing a layer of $WSi_x$ over the surface of said polished layer of inter level dielectric thereby including said recess in said gate;

patterning said layer of $WSi_x$ whereby said whereby said patterning exposes said layer of $WSi_x$ in a pattern that is the mirror image of said layer of $WSi_x$ above the surface of said gate electrode thereby including an extension of said layer of $WSi_x$ that is contiguous with and extends from said layer of $WSi_x$ above the surface of said gate electrode; and etching said layer of WSi$_x$ thereby leaving said layer of WSi$_x$ in place above the surface of said gate whereby said etching furthermore leaves in place said layer of WSi$_x$ over a region that is contiguous with and extends from said layer of WSi$_x$ in place above the surface of said gate.

17. The method of claim 16 wherein said creation of said recessed gate electrode structure comprises the steps of:

providing a semiconductor substrate; forming a pattern of active regions on the surface of said substrate;

growing a layer of gate base material on the surface of said substrate in said active area whereby said layer of gate base material serves as a stress relieve buffer between said gate electrode and the underlying silicon substrate;

depositing a layer of gate electrode material over the surface of said substrate;

depositing a layer of gate contact material over the surface of said gate electrode material;

masking and anisotropically etching said layer of gate contact material and said layer of gate electrode material and said layer of gate base material to form a gate electrode structure overlaid by a layer of gate contact material;

depositing a liner over the surface of said gate electrode and said active regions;

performing a self-aligned LDD implant into the surface of said substrate;

depositing a layer of gate spacer material over said layer of liner;

forming gate spacers on the sidewalls of said gate;

performing a self-aligned source/drain implant into the surface of said substrate;

depositing a layer of salicidable material over said gate and the surface of said substrate;

performing a rapid thermal anneal of said layer of salicidable material to form reacted and unreacted silicides;

performing an etchback of said unreacted silicides thereby leaving a thin layer of reacted silicides over the surface of said source and drain regions;

performing a rapid thermal anneal of said thin layer of high resistivity reacted silicide over the surface of said source and drain regions thereby forming low resistivity silicide layers over the surface of said source and drain regions;

depositing a layer of inter level dielectric over the surface of said substrate;

polishing said layer of inter level dielectric down to the surface of said layer of gate electrode contact material; and removing said layer of gate contact material from said gate thereby creating a recessed gate.

18. The method of claim 16 wherein said layer WSi$_x$ has a thickness between about 1000 and 2000 angstrom.

19. A method of creating MOS devices with salicided gate and source and drain, comprising the steps of:

providing a semiconductor substrate; forming a pattern of active regions in the surface of said substrate;

growing a layer of gate base material on the surface of said substrate over said active area whereby said layer of gate base material serves as a stress relieve layer between said gate structure and said substrate;

depositing a layer of gate electrode material over the surface of said layer of gate base material;

depositing a layer of gate contact material over the surface of said layer of gate electrode material;

patterning and anisotropically ion etching said layer of gate contact material and said layer of gate electrode material and said layer of gate base material thereby forming said gate electrode structure that is overlaid with said gate contact material;

depositing a liner over the surface of said gate electrode and said active region;

performing a self-aligned LDD implant into the surface of said substrate;

depositing a layer of gate spacer material over said liner; forming gate spacers on the sidewalls of said gate electrode; performing a self-aligned source/drain implant into the surface of said substrate;

depositing a layer of material that can be salicided over said gate electrode and the surface of said substrate;

performing a rapid thermal anneal of said layer of salicidable material to form reacted and unreacted silicides;

performing an etchback of said unreacted silicides thereby leaving thin layers of reacted silicides over the surface of said source and drain regions;

performing a rapid thermal anneal of said thin layers of reacted silicides over the surface of said source and drain regions thereby forming low resistivity silicide layers over the surface of said source and drain regions;

depositing a layer of inter level dielectric over the surface of said substrate thereby including said gate electrode;

polishing said layer of inter level dielectric down to the surface of said layer of gate contact material of said gate electrode;

removing said layer of gate contact material from said gate thereby creating a recessed gate;

depositing a layer of WSi$_x$ over the surface of said polished layer of inter level dielectric thereby including said recess in said gate;

patterning said layer of WSi$_x$ whereby said patterning exposes said layer of WSi$_x$ in a pattern that is the mirror image of said layer of WSi$_x$ above the surface of said gate electrode thereby including an extension of said layer of WSi$_x$ that is contiguous with and extends from said layer of layer of WSi$_x$ above the surface of said gate electrode; and etching said layer of WSi$_x$ in accordance with said pattern thereby leaving said layer of WSi$_x$ in place above the surface of said gate whereby said etching furthermore leaves in place said layer of WSi$_x$ over a region that is contiguous with and extends from above the surface of said gate.

20. The method of claim 19 wherein said layer of gate contact material has a thickness between about 1500 and 3000 Angstrom.

21. The method of claim 19 wherein said layer of salicidable material has a thickness between about 250 and 350 Angstrom.

22. The method of claim 19 wherein said layer WSi$_x$ has a thickness between about 1000 and 2000 angstrom.

23. The method of claim 19 wherein said performing a rapid thermal anneal of said layer of salicidable material is performed in a temperature range of between about 600 and 800 degrees C. for a time between about 20 and 40 seconds in N$_2$ ambient.

24. The method of claim 19 wherein said performing a rapid thermal anneal of said salicidable material is performed in a temperature range of between 600 and 700 degrees C. for a time of between 20 and 40 seconds and then rapid thermal annealing in a temperature of between about 800 and 900 degrees C. for a time between 20 and 40 seconds.

25. A method of forming contacts to gate electrode structures, comprising the steps of:

providing a semiconductor substrate whereby a recessed gate electrode structure has been created on the surface of said substrate whereby said recessed gate electrode is surrounding by a layer of Inter Level Dielectric (ILD);

depositing a thin layer of electrically conductive material over the surface of said layer of ILD thereby including the recess of said gate electrode; and patterning and etching said layer of electrically conductive material thereby leaving said layer of electrically conductive material in place above the surface of said gate electrode whereby said etching furthermore leaves in place said layer of electrically conductive material overlaying said layer of ILD over a region that is contiguous with and extends from above the surface of said gate.

26. The method of claim 25 wherein said creation of said recessed gate electrode structure comprises the steps of: providing a semiconductor substrate;

forming a pattern of active regions in the surface of said substrate;

growing a gate base layer on the surface of said substrate over said active area whereby said base gate layer serves as a stress relieve layer between said gate structure and said substrate;

depositing a layer of gate electrode material over the surface of said gate base layer;

depositing a layer of gate contact material over the surface of said gate electrode material;

patterning and anisotropically ion etching said layer of gate contact material and said layer of gate electrode material and said gate base layer material thereby forming said gate electrode structure that is overlaid with said gate contact material;

depositing a liner over the surface of said gate and said active region;

performing a self-aligned LDD implant into the surface of said substrate;

depositing a layer of gate spacer material over said liner;

forming gate spacers on the sidewalls of said gate;

performing a self-aligned source/drain implant into the surface of said substrate;

depositing a layer of material that can be salicided over said gate and the surface of said substrate;

performing a rapid thermal anneal of said layer of salicidable material to form silicides;

performing an etchback of said silicides thereby leaving thin layers of silicides over the surface of said source and drain regions;

performing a rapid thermal anneal of said thin layers of silicide over the surface of said source and drain regions thereby forming low resistivity silicide layers over the surface of said source and drain regions;

depositing a layer of inter level dielectric over the surface of said substrate;

polishing said layer of inter level dielectric down to the surface of said layer of gate contact material of said gate electrode; and removing said layer of gate contact material from said gate thereby creating said recessed gate.

27. The method of claim 25 whereby said electrically conductive material contains materials that can be salicided.

28. The method of claim 26 with the additional step of saliciding said electrically conductive material thereby forming silicides.

* * * * *